United States Patent
Baker

(10) Patent No.: US 8,324,008 B2
(45) Date of Patent: Dec. 4, 2012

(54) METHOD OF PATTERNING A MESOPOROUS NANO PARTICULATE LAYER

(75) Inventor: Julie Baker, Leavesden (GB)

(73) Assignee: Eastman Kodak Company, Rochester, NY (US)

( * ) Notice: Subject to any disclaimer, the term of this patent is extended or adjusted under 35 U.S.C. 154(b) by 405 days.

(21) Appl. No.: 12/677,132

(22) PCT Filed: Sep. 9, 2008

(86) PCT No.: PCT/GB2008/003054
§ 371 (c)(1),
(2), (4) Date: Mar. 9, 2010

(87) PCT Pub. No.: WO2009/040499
PCT Pub. Date: Apr. 2, 2009

(65) Prior Publication Data
US 2010/0186800 A1    Jul. 29, 2010

(30) Foreign Application Priority Data
Sep. 26, 2007    (GB) .................................. 0718839.4

(51) Int. Cl.
*H01L 21/00* (2006.01)
(52) U.S. Cl. ........................................................ 438/57
(58) Field of Classification Search ...................... 438/57
See application file for complete search history.

(56) References Cited

U.S. PATENT DOCUMENTS
2007/0025139 A1    2/2007  Parsons

OTHER PUBLICATIONS

Ito et al, "High-efficiency (7.2%) flexible dye-sensitized solar cells with Ti-metal substrate for nanocrystalline-TiO2 photoanode", Chemical Communications, Aug. 14, 2006, pp. 4004-4006—XP002507808.
Triani et al, "Nanostructured TiO2 membranes by atomic layer deposition", J. of Mat. Chem R. Soc Chem UK, vol. 15, No. 14, Apr. 14, 2006 pp. 1355-1359—XP002507809.
Murakami et al, Low temperature preparation of mesoporous TiO2 films for efficient dye-sensitized photoelectrode by chemical vapor deposition combined with UV light irradiation, J. of Photochemistry and Photobiology A: Chemistry, vol. 164, No. 1-3, Jun. 1, 2004 pp. 187-191—XP002507810.
Miyasaka et al, "Fabrication of Dye-Sensitized Plastic Film Electrodes for Flexible Solar Cells Based on Electrophoretic Deposition Techniques" Proceedings of the SPIE, SPIE, vol. 5215, No. 1. Aug. 8, 2003, pp. 219-225, XP001193708.

*Primary Examiner* — Roberto Velez
*Assistant Examiner* — Nicholas J Choi
(74) *Attorney, Agent, or Firm* — J. Lanny Tucker

(57) ABSTRACT

A method of patterning a mesoporous nano particulate layer on a conductive substrate comprises the steps of depositing a pattern on the conductive substrate, depositing a layer of titanium dioxide by atomic layer deposition on the substrate, removing the underlying pattern with a solvent to leave discrete areas of titanium dioxide, depositing a mesoporous nano particulate layer over the whole substrate, and depositing a second layer of titanium dioxide by atomic layer deposition above the mesoporous nano particulate layer whereby the areas of mesoporous nano particulate layer and second titanium dioxide layer over the areas where the first layer of titanium dioxide was removed with the solvent fall off, leaving the patterned mesoporous nano particulate layer.

12 Claims, 9 Drawing Sheets

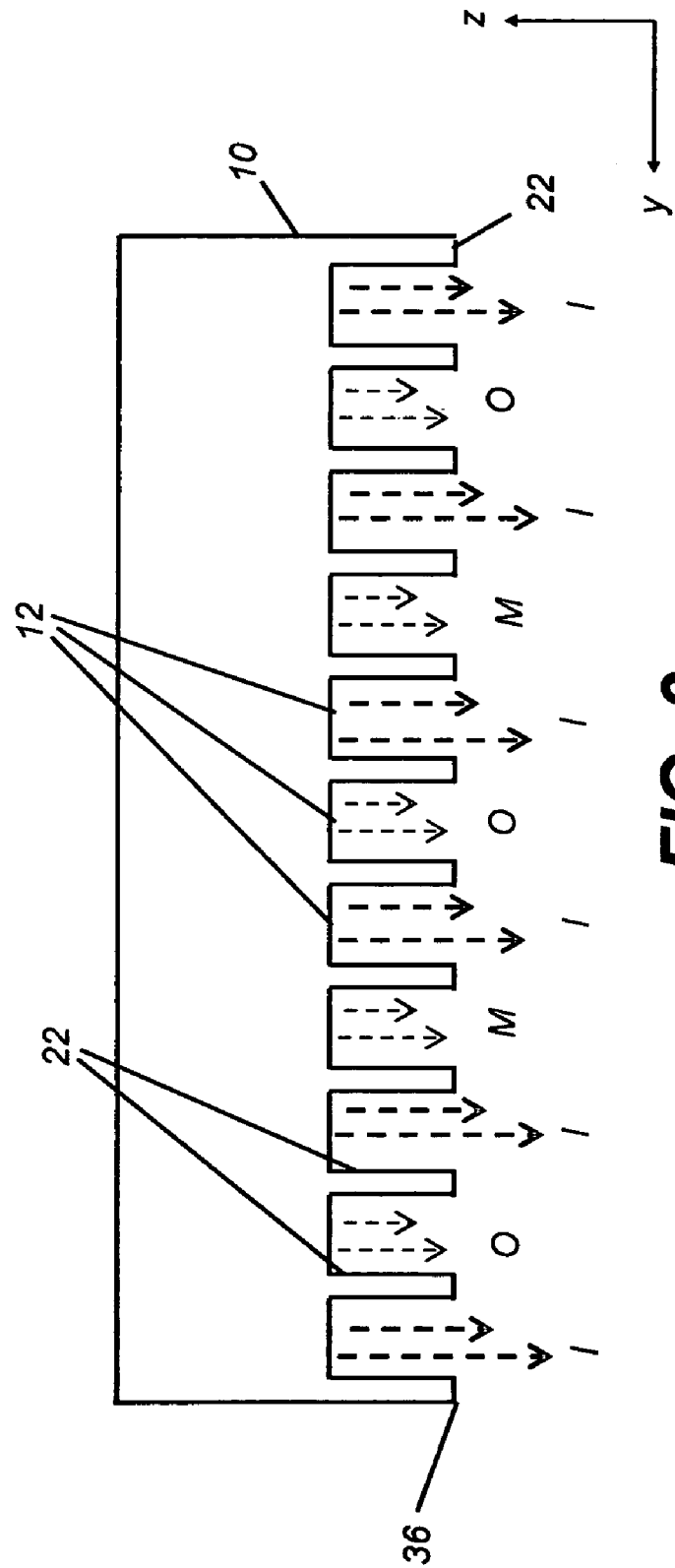

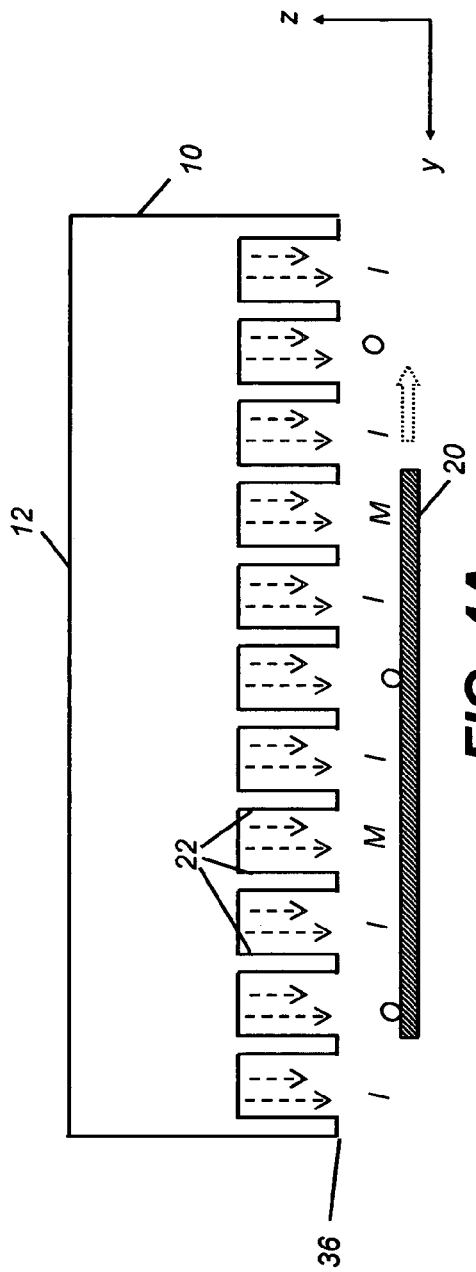
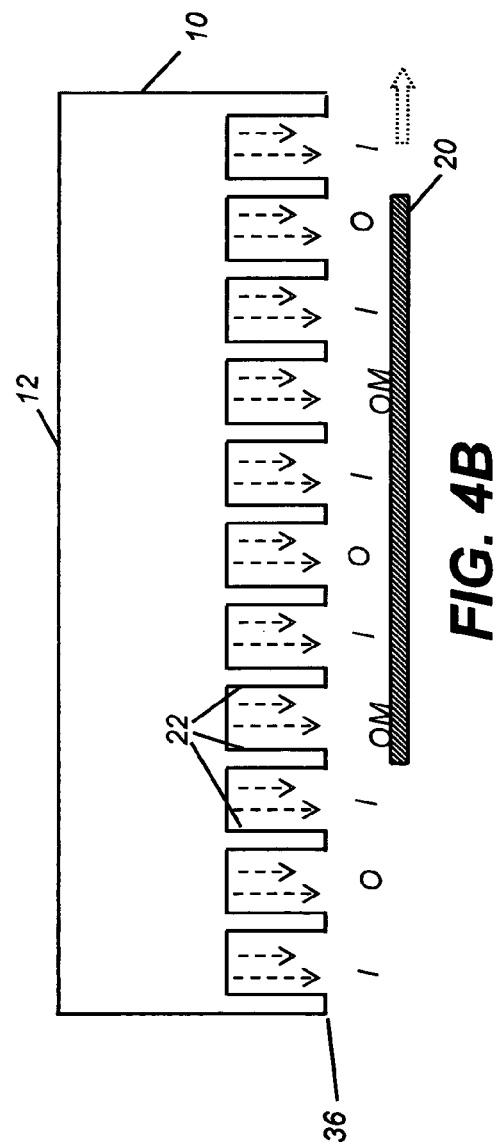

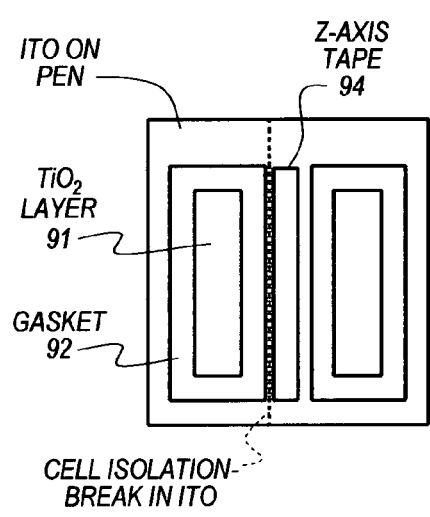 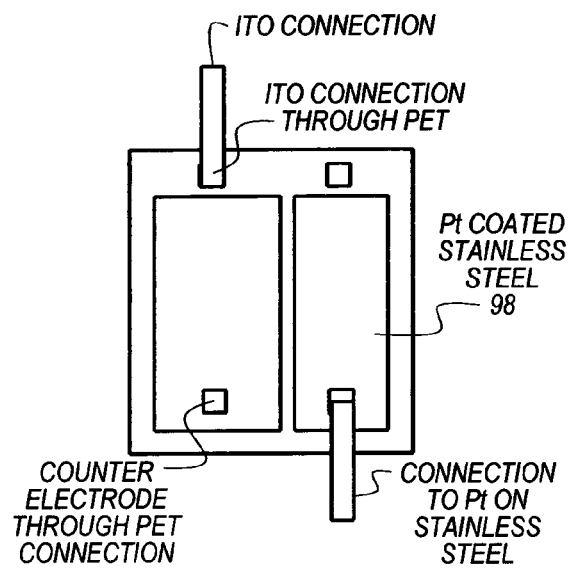
FIG. 11A   FIG. 11B
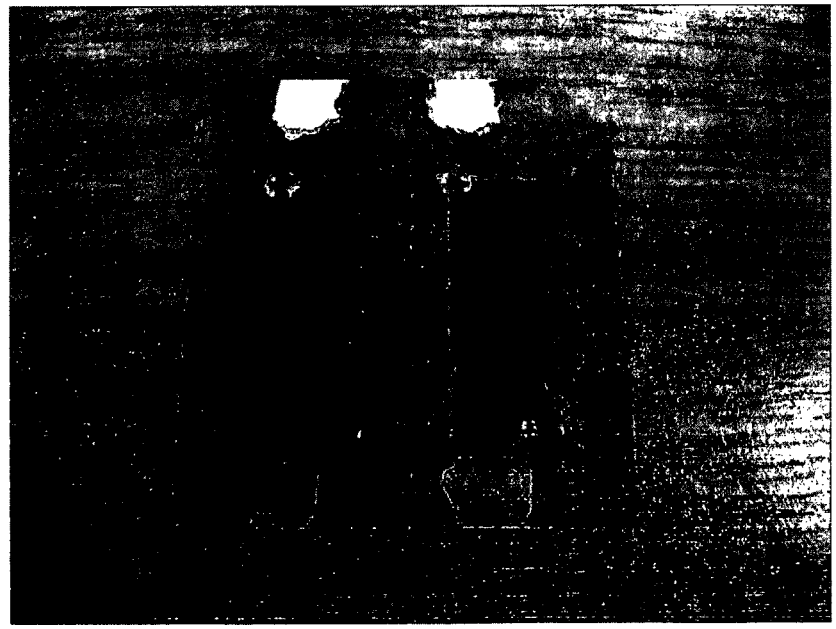
FIG. 12

METHOD OF PATTERNING A MESOPOROUS NANO PARTICULATE LAYER

The application claims the benefit of PCT/GB08/03054, filed on Sep. 9, 2008 and United Kingdom Application No. 0718839.4, filed on Sep. 26, 2007, the disclosures of which are incorporated herein in their entirety by reference.

FIELD OF THE INVENTION

This invention relates to a method of patterning a substrate, in particular to a method of patterning a mesoporous nano particulate layer on the substrate, which may be used to fabricate a photovoltaic module.

BACKGROUND OF THE INVENTION

Conventional dye-sensitized solar cells as described by Gratzel consist of a transparent conducting substrate such as ITO on glass or plastic, on top of which is a sintered layer of titanium dioxide nanoparticles coated with dye (the anode). A hole carrying electrolyte which typically contains iodide/tri-iodide as the electron (or hole) transfer agent is placed within the pores of and on top of this layer. The solar cell sandwich is completed by putting on top of the electrolyte a catalytic conducting electrode, often made with platinum as the catalyst (the cathode). When light is shone on the cell, the dye is excited and an electron is injected into the titanium dioxide structure. The excited, now positively charged dye oxidises the reduced form of the redox couple in the electrolyte to its oxidised form e.g. iodide goes to tri-iodide. This may now diffuse towards the platinum electrode. When the cell is connected to a load the electrons from the anode pass through the load to the cathode and at the cathode the oxidised form of the redox couple is reduced e.g. tri-iodide to iodide, completing the reaction.

Conventional methods of patterning the mesoporous nanoparticulate layer include amongst others extrusion coating, screen printing and gravure printing.

U.S. Pat. No. 7,186,911 discloses a dye sensitised nanoparticulate material which may be deposited by applying a solution of metal oxide nanoparticles onto a substrate using suitable techniques such as extrusion coating, spray coating, screen printing and gravure printing.

U.S. Pat. No. 6,991,958 discloses a method of templating charge-carrier-transporting channel layers. These layers are formed by initially depositing a removable template on the conductive substrate that may include single or multi layers of nanoparticles e.g. polystyrene nanospheres. The layer of first charge-carrier-transporting material e.g. $TiO_2$ is then deposited on the template using techniques such as spin coating, casting, evaporation or any other technique known in the art for depositing a material on a substrate. The template is then removed.

U.S. Pat. No. 6,713,389 discloses a method of using a droplet deposition technique and a continuous inkjet printhead (and electrostatic spray head) to eject droplets of an array of custom fluids that when suitably dried/solidified on a specific surface form the elements of a solar cell (PV) device. Materials used in this process may include metallo-organics such as $TiO_2$.

GB 2427963 discloses a dye sensitised solar cell comprising a first patterned transparent conducting electrode with alternate sections of a second electrode layer and metal oxide dye sensitised layer. In this application, the patterned transparent electrode layer (e.g. ITO) is patterned using techniques such as contact printing, lithography etc. The second electrode layer (eg Pt) and the metal oxide layer (eg $TiO_2$) are both patterned using a mask.

Problem to be Solved by the Invention

The invention aims to provide an improved low cost method of patterning a mesoporous nano particulate layer which is preferably compatible with roll to roll processes.

SUMMARY OF THE INVENTION

Self patterned mesoporous nano particulate layers may be created by patterning a thin layer of $TiO_2$ deposited on the conducting electrode such that this layer is only in the areas where the active areas of the final module are to be. The mesoporous nanoparticulate layer is then deposited over the whole substrate area, followed by a further thin $TiO_2$ layer. Where there is no $TiO_2$ layer present on the conducting electrode below the mesoporous layer all of the layers above fall off the substrate leaving patterned mesoporous nano particulate layers which may be used to create a PV module.

According to the present invention there is provided a method of patterning a mesoporous nano particulate layer on a conductive substrate comprising the steps of depositing a pattern on the conductive substrate, depositing a layer of titanium dioxide by atomic layer deposition on the substrate, removing the underlying pattern with a solvent to leave discrete areas of titanium dioxide, depositing a mesoporous nano particulate layer over the whole substrate, and depositing a second layer of titanium dioxide by atomic layer deposition above the mesoporous nano particulate layer whereby the areas of mesoporous nano particulate layer and second titanium dioxide layer over the areas where the first layer of titanium dioxide was removed with the solvent fall off, leaving the patterned mesoporous nano particulate layer.

Advantageous Effect of the Invention

The present invention provides a low cost method of self patterning active areas of mesoporous layers that may be used to create a PV module which is compatible with roll to roll processes.

BRIEF DESCRIPTION OF THE DRAWINGS

The invention will now be described with reference to the accompanying drawings in which:

FIG. 3 is a cross sectional side view of an embodiment of the distribution of gaseous materials to a substrate that is subject to thin film deposition;

FIGS. 4A and 4B are cross sectional views of an embodiment of the distribution of gaseous materials schematically showing the accompanying deposition operation;

FIGS. 11A and 11B are schematic views of the front view of the working electrode and the back view of the counter electrode, respectively;

FIG. 12 illustrates the completed PV module; and

DETAILED DESCRIPTION OF THE INVENTION

Figure 1:
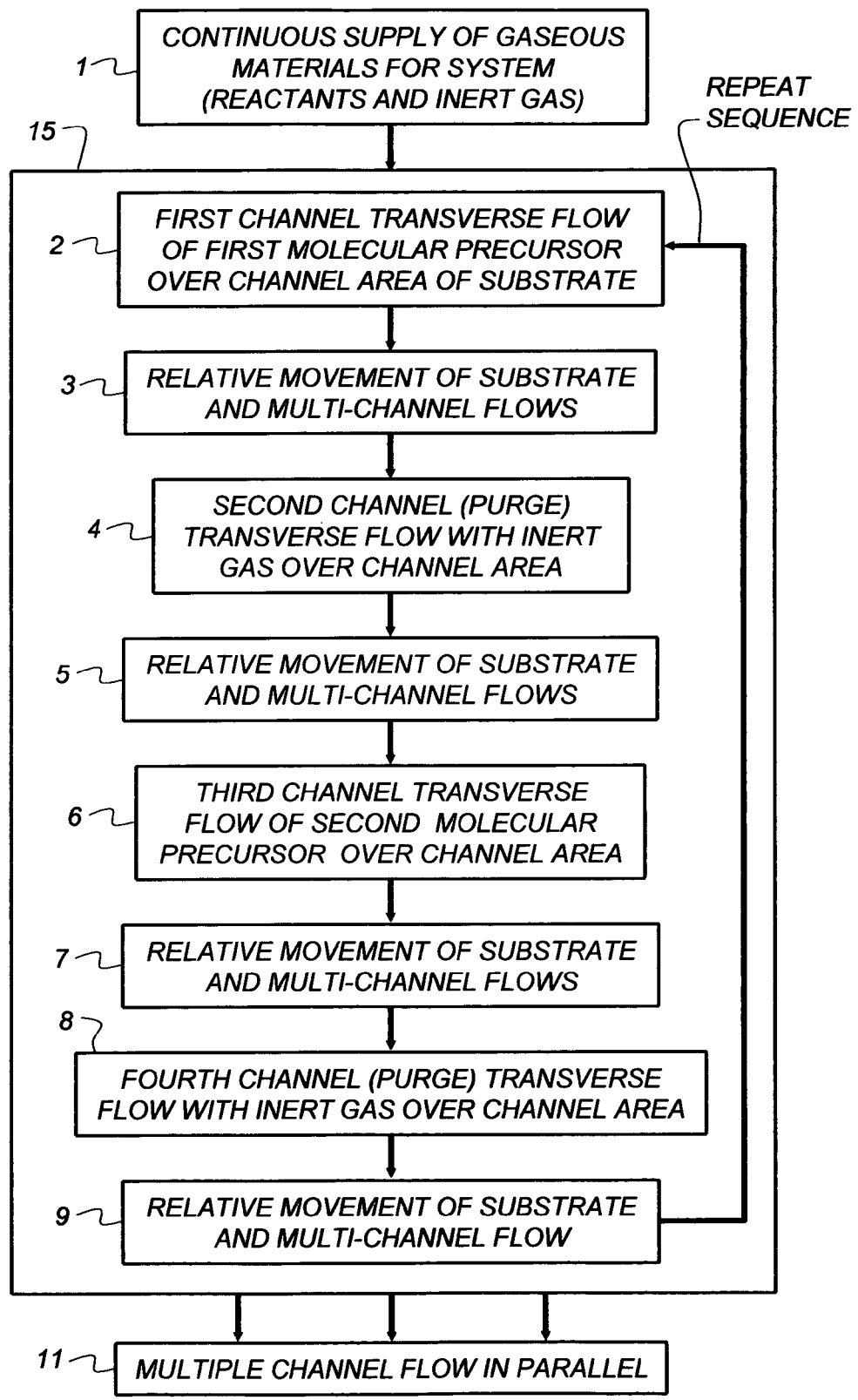
FIG. 1 is a flow chart describing the steps of an atomic layer deposition (ALD) process that may be used in the present invention.

FIG. 1 is a generalized step diagram of a process for practicing the present invention. Two reactive gases are used, a first molecular precursor and a second molecular precursor. Gases are supplied from a gas source and can be delivered to the substrate, for example, via a distribution manifold. Metering and valving apparatus for providing gaseous materials to the distribution manifold can be used.

As shown in Step 1, a continuous supply of gaseous materials for the system is provided for depositing a thin film of material on a substrate. The Steps in Sequence 15 are sequentially applied. In Step 2, with respect to a given area of the substrate (referred to as the channel area), a first molecular precursor or reactive gaseous material is directed to flow in a first channel transversely over the channel area of the substrate and reacts therewith. In Step 3 relative movement of the substrate and the multi-channel flows in the system occurs, which sets the stage for Step 4, in which second channel (purge) flow with inert gas occurs over the given channel area. Then, in Step 5, relative movement of the substrate and the multi-channel flows sets the stage for Step 6, in which the given channel area is subjected to atomic layer deposition in which a second molecular precursor now transversely flows (substantially parallel to the surface of the substrate) over the given channel area of the substrate and reacts with the previous layer on the substrate to produce (theoretically) a monolayer of a desired material. Often in such processes, a first molecular precursor is a metal-containing compound in gas form (for example, a metallic compound such as titanium tetrachloride) and the material deposited is a metal-containing compound (for example titanium dioxide). In such an embodiment, the second molecular precursor can be, for example, a non-metallic oxidizing compound or hydrolyzing compound, e.g. water.

In Step 7, relative movement of the substrate and the multi-channel flows then sets the stage for Step 8 in which again an inert gas is used, this time to sweep excess second molecular precursor from the given channel area from the previous Step 6. In Step 9, relative movement of the substrate and the multi-channels occurs again, which sets the stage for a repeat sequence, back to Step 2. The cycle is repeated as many times as is necessary to establish a desired film or layer. The steps may be repeated with respect to a given channel area of the substrate, corresponding to the area covered by a flow channel. Meanwhile the various channels are being supplied with the necessary gaseous materials in Step 1. Simultaneous with the sequence of box 15 in FIG. 1, other adjacent channel areas are being processed simultaneously, which results in multiple channel flows in parallel, as indicated in overall Step 11.

The primary purpose of the second molecular precursor is to condition the substrate surface back toward reactivity with the first molecular precursor. The second molecular precursor also provides material as a molecular gas to combine with one or more metal compounds at the surface, forming compounds such as an oxide, nitride, sulfide, etc, with the freshly deposited metal-containing precursor.

The continuous ALD purge does not need to use a vacuum purge to remove a molecular precursor after applying it to the substrate.

Assuming that two reactant gases, AX and BY, are used, when the reaction gas AX flow is supplied and flowed over a given substrate area, atoms of the reaction gas AX are chemically adsorbed on a substrate, resulting in a layer of A and a surface of ligand X (associative chemisorptions) (Step 2). Then, the remaining reaction gas AX is purged with an inert gas (Step 4). Then, the flow of reaction gas BY, and a chemical reaction between AX (surface) and BY (gas) occurs, resulting in a molecular layer of AB on the substrate (dissociative chemisorptions) (Step 6). The remaining gas BY and by-products of the reaction are purged (Step 8). The thickness of the thin film can be increased by repeating the process cycle (steps 2-9).

Because the film can be deposited one monolayer at a time it tends to be conformal and have uniform thickness.

Figure 2:
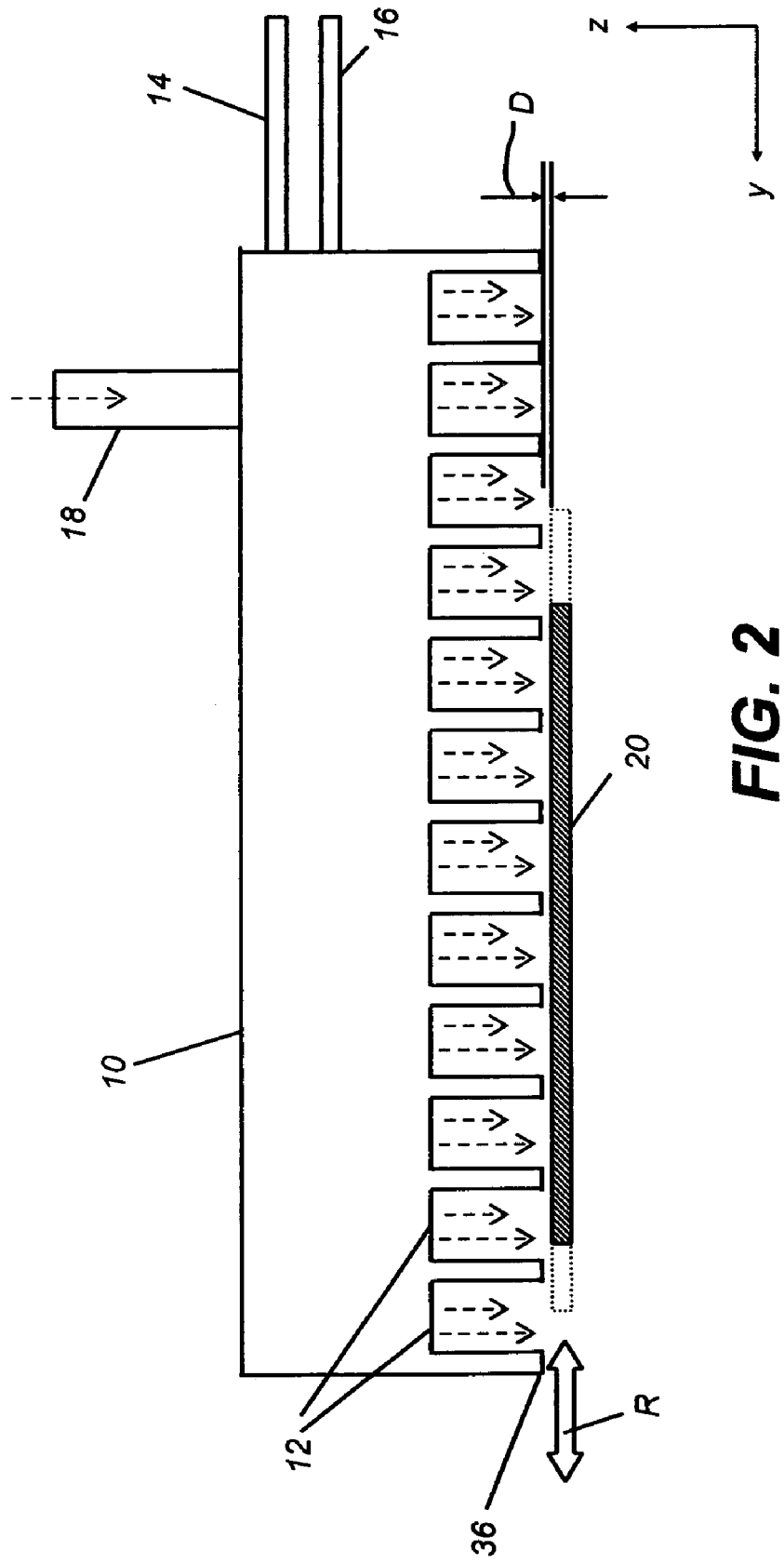
FIG. 2 is a cross sectional side view of an embodiment of a distribution manifold for atomic layer deposition that can be used in the present process.

Referring now to FIG. 2, there is shown a cross-sectional side view of one embodiment of a distribution manifold 10 that can be used in the present process for atomic layer deposition onto a substrate 20. Distribution manifold 10 has a gas inlet port 14 for accepting a first gaseous material, a gas inlet port 16 for accepting a second gaseous material, and a gas inlet port 18 for accepting a third gaseous material. These gases are emitted at an output face 36 via output channels 12, having a structural arrangement described subsequently. The arrows in FIG. 2 refer to the diffusive transport of the gaseous material, and not the flow, received from an output channel. The flow is substantially directed out of the page of the figure.

Gas inlet ports 14 and 16 are adapted to accept first and second gases that react sequentially on the substrate surface to effect ALD deposition, and gas inlet port 18 receives a purge gas that is inert with respect to the first and second gases. Distribution manifold 10 is spaced a distance D from substrate 20, provided on a substrate support. Reciprocating motion can be provided between substrate 20 and distribution manifold 10, either by movement of substrate 20, by movement of distribution manifold 10, or by movement of both substrate 20 and distribution manifold 10. In the particular embodiment shown in FIG. 2, substrate 20 is moved across output face 36 in reciprocating fashion, as indicated by the arrow R and by phantom outlines to the right and left of substrate 20 in FIG. 2. It should be noted that reciprocating motion is not always required for thin-film deposition using distribution manifold 10. Other types of relative motion between substrate 20 and distribution manifold 10 could also be provided, such as movement of either substrate 20 or distribution manifold 10 in one or more directions.

The cross-sectional view of FIG. 3 shows gas flows emitted over a portion of front face 36 of distribution manifold 10. In this particular arrangement, each output channel 12 is in gaseous flow communication with one of gas inlet ports 14, 16 or 18 seen in FIG. 2. Each output channel 12 delivers typically a first reactant gaseous material O, or a second reactant gaseous material M, or a third inert gaseous material I.

FIG. 3 shows a relatively basic or simple arrangement of gases. It is possible that a plurality of non-metal deposition precursors (like material O) or a plurality of metal-containing precursor materials (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. The critical requirement is that an inert stream labeled I should separate any reactant channels in which the gases are likely to react with each other. First and second reactant gaseous materials O and M react with each other to effect ALD deposition, but neither reactant gaseous material O nor M reacts with inert gaseous material I.

The cross-sectional views of FIGS. 4A and 4B show, in simplified schematic form, the ALD coating operation performed as substrate 20 passes along output face 36 of distribution manifold 10 when delivering reactant gaseous materials O and M. In FIG. 4A, the surface of substrate 20 first receives an oxidizing material from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials.

As FIGS. 4A and 4B show, inert gaseous material I is provided in every alternate output channel 12, between the flows of first and second reactant gaseous materials O and M. Sequential output channels 12 are adjacent, that is, share a common boundary, formed by partitions 22 in the embodiments shown. Here, output channels 12 are defined and separated from each other by partitions 22 that extend perpendicular to the surface of substrate 20.

Notably, there are no vacuum channels interspersed between the output channels 12, that is, no vacuum channels on either side of a channel delivering gaseous materials to draw the gaseous materials around the partitions. This advantageous, compact arrangement is possible because of the innovative gas flow that is used. Unlike gas delivery arrays of earlier processes that apply substantially vertical (that is, perpendicular) gas flows against the substrate and should then draw off spent gases in the opposite vertical direction, distribution manifold 10 directs a gas flow (preferably substantially laminar in one embodiment) along the surface for each reactant and inert gas and handles spent gases and reaction by-products in a different manner. The gas flow used in the present invention is directed along and generally parallel to the plane of the substrate surface. In other words, the flow of gases is substantially transverse to the plane of a substrate rather than perpendicular to the substrate being treated.

The above described method and apparatus are one example of a vapour deposition process that can by used in the present invention. Other vapour deposition methods may be used.

EXAMPLE

Figure 5:
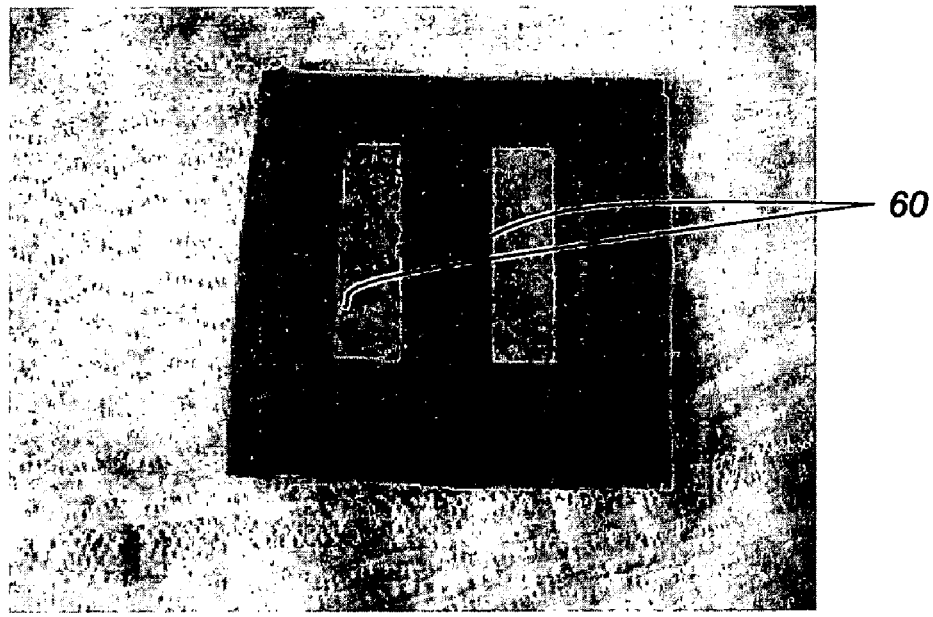
FIG. 5 illustrates patterning of a substrate using a Staedler marker pen.

A sample of 13 Ω/square ITO-PEN was taken and patterned using a Staedtler marker pen (see FIG. 5). The two long thin areas 60 not covered with marker pen are the areas where the patterned mesoporous nano-particulate layers will be in the final cell.

Figure 6:
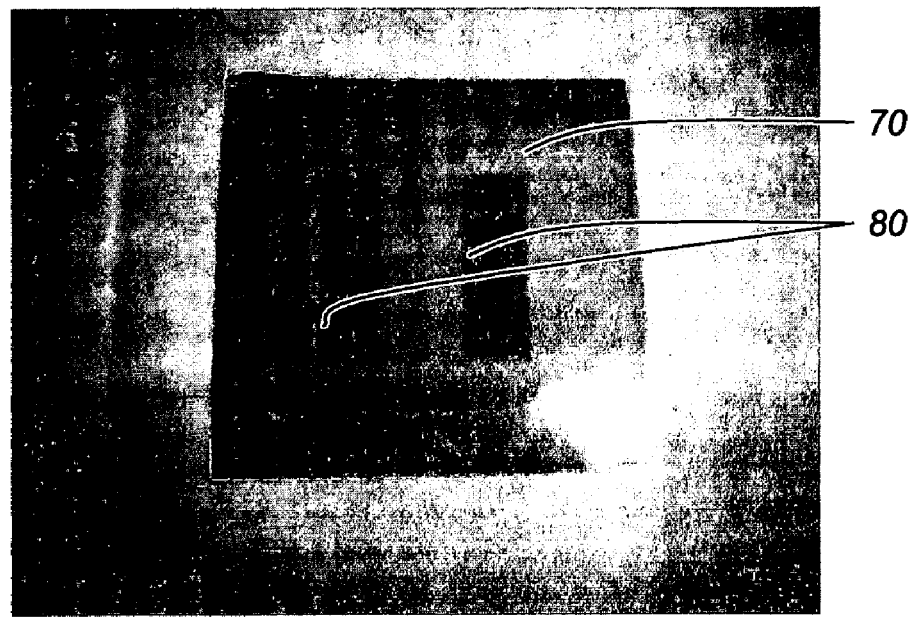
FIG. 6 illustrates patterning of a substrate using a fluoropolymer deposited using a Dimatix inkjet printer.

An alternative method of patterning the substrate could be to inkjet a fluoropolymer down in the desired pattern (e.g. a mix of FluoroPel PFC604A (from Cytonix Corporation) and Perfluorodecalin (Aldrich) may be used in a 25/75 ratio). An image of a patterned square of ITO-PEN using this method can be seen in FIG. 6. Area 70 is the fluoropolymer patterned area. Area 80 is the area with no fluoropolymer.

For this example, the ITO-PEN was patterned using the Staedtler pen as shown in FIG. 5.

A 3 nm $TiO_2$ layer was then deposited over the entire substrate using atmospheric pressure atomic layer deposition (AP-ALD). The conditions used for the deposition are shown in Table 1.

TABLE 1

| AP-ALD conditions used to deposit first $TiO_2$ layer on the ITO-PEN support | | |
|---|---|---|
| Bubbler 1 | Material | Water |
| | Flow rate | 22 ml/min |
| Bubbler 2 | Material | $TiCl_4$ |
| | Flow rate | 48 ml/min |
| Carrier gas flow | Inert ($N_2$) | 2000 ml/min |
| | Water (compressed air) | 300 ml/min |
| | Metal ($N_2$) | 200 ml/min |
| Temperature | Platen | 95-105° C. |
| | Coating Head | 50° C. |
| Deposition Settings | No. of oscillations | 10 |
| | Platen speed | 25 mm/sec |
| | Head height | 55 μm |
| Thickness of $TiO_2$ Layer | | ~3 nm |

Figure 7:
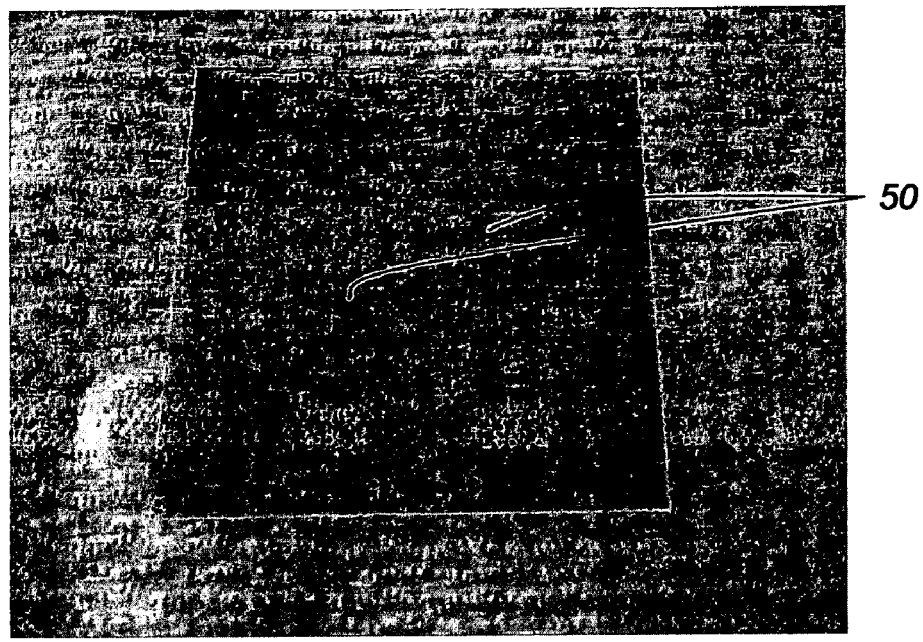
FIG. 7 illustrates the ITO PEN substrate patterned with AP-ALD (atmospheric pressure atomic layer deposition) $TiO_2$ layer in desired areas.
Figure 8:
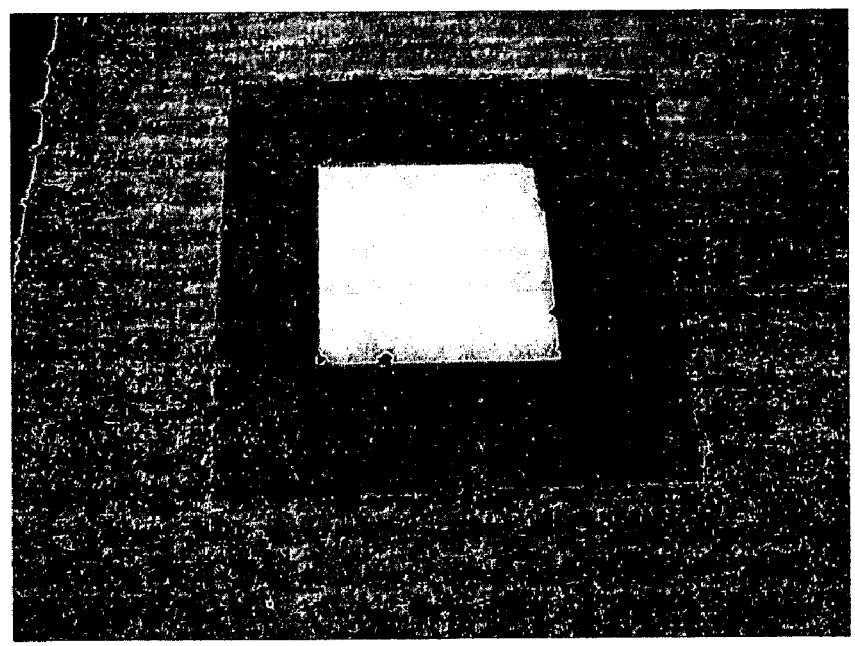
FIG. 8 illustrates the substrate shown in FIG. 7 covered with a mesoporous nano particulate layer.

The marker pen patterned area was then removed using acetone. As the AP-ALD $TiO_2$ layer had been deposited on top of the marker pen, removal of the marker pen also resulted in removal of the AP-ALD $TiO_2$ layer in that area, only leaving the AP-ALD $TiO_2$ layer in the areas where the patterned mesoporous nano-particulate layers will be in the final cell (see FIG. 7). Areas 50 illustrate where the $TiO_2$ layer remains.

This support was then used to make a dye sensitized solar cell module.

Some titanium dioxide was dried in an oven at 90° C. overnight prior to use. This was a titanium dioxide sample which had an average particle size of 21 nm (Degussa Aeroxide P25, specific surface area (BET)=50+/−15 $m^2/g$). The flexible dye sensitised solar cell module was fabricated as follows.

Layers of mesoporous $TiO_2$ films approximately 30 μm thick were deposited onto the patterned 13 Ω/square ITO-PEN by dispersing the dried $TiO_2$ in a mixture of dry Methyl Ethyl Ketone and Ethyl Acetate in the following amounts:

| Degussa P25 $TiO_2$ (21 nm particles) | 1.35 g |
|---|---|
| Methyl Ethyl Ketone | 45 g |
| Ethyl Acetate | 5 g |

The resulting mixture was sonicated for 15 minutes before being sprayed over the entire area of conducting plastic substrate from a distance of approximately 25 cm using a SATAminijet 3 HVLP spry gun with a 1 mm nozzle and 2 bar nitrogen carrier gas. The layer was allowed to dry in an oven at 90° C. for one hour, before being placed between two sheets of Teflon, sandwiched between two polished stainless steel bolsters and compressed with a pressure of 3.75 tonnes/$cm^2$ for 15 seconds.

The sintered layer was then allowed to dry for a further hour at 90° C.

A further 3 nm $TiO_2$ layer was then deposited over the entire mesoporous nano-particulate $TiO_2$ layer using AP-ALD. The conditions used for the deposition, were the same as those shown in Table 1.

Figure 9:
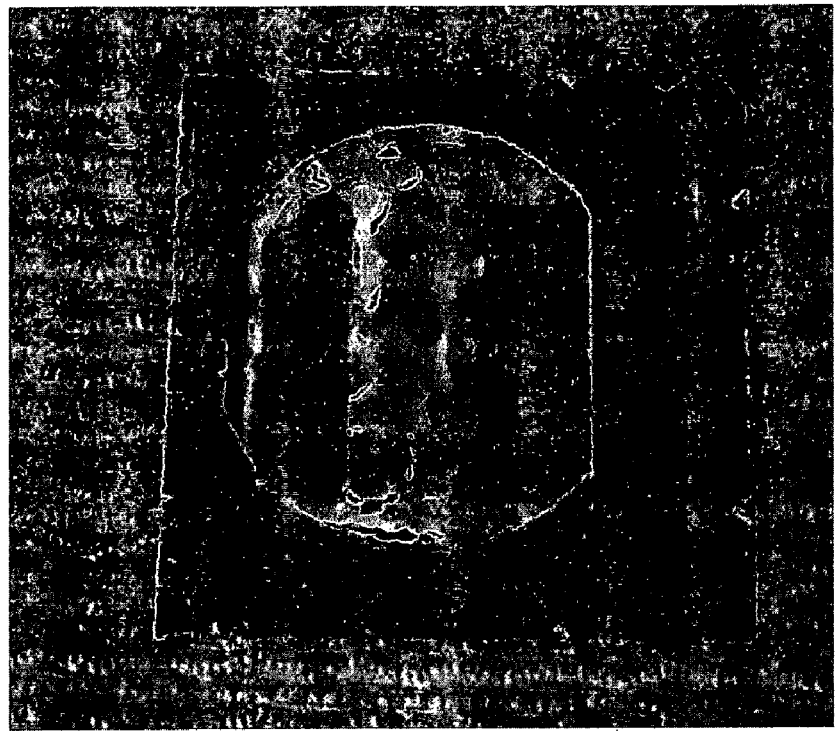
FIG. 9 illustrates the substrate after a further AP-ALD $TiO_2$ layer has been deposited over the entire substrate and self patterning takes place.

In the areas where the first AP-ALD TiO$_2$ layer had been removed when the marker pen pattern was wiped away, the structure falls off the support, leaving patterned mesoporous nano-particulate layers which may be used to create a PV module (see FIG. 9). The sample was then placed in the oven to dry for a further hour.

Figure 10:
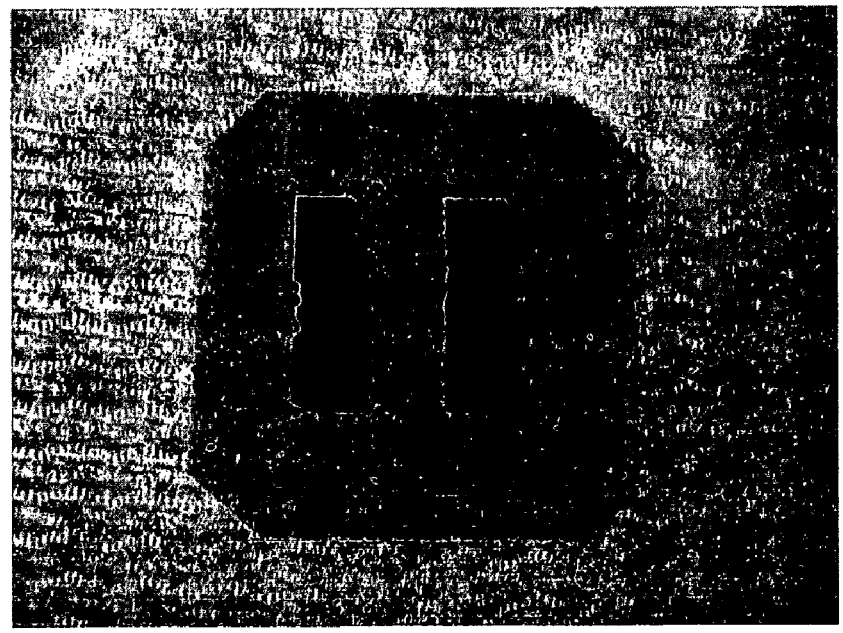
FIG. 10 illustrates the substrate after sensitisation.

The entire sample was then sensitised by placing them in a $3\times10^{-4}$ mol dm$^{-3}$ solution of ruthenium cis-bis-isothiocyanato bis(2,2'bipyridyl-4,4'dicarboxylic acid) overnight. FIG. 10 shows the dyed patterned mesoporous nano-particulate layers that may be used to create a PV module.

This sample was then used to construct a dye sensitised solar cell module.

Platinum coated stainless steel foil electrodes were prepared by sputter deposition under vacuum.

Platinum coated stainless steel 98 was adhered to a piece of uncoated PET with a window cut to allow access to the back of the stainless steel counter electrode. A further window was cut into the PET to allow access to the ITO/PEN working electrode. The ITO was scored with a scalpel blade so as to break the ITO coating between the two dye sensitised mesoporous layers 91 but not separate the base areas and z-axis tape 94 was used to create the serial interconnect between the two areas. 3M Thermoset 615 material was used for the gasket 92.

The dye sensitised TiO$_2$ layers and the platinum counter electrode were arranged to create a module as shown in FIGS. 11A and 11B.

Each side of the module was filled with an ionic liquid electrolyte comprising:
0.1M LiI
0.6M DMPII (1,2,dimethyl-3-propyl-imidazolium iodide)
0.05M I$_2$
0.5M N-methylbenzimidazole
Solvent=MPN (Methoxypropionitrile)

FIG. 12 shows the completed module.

Following fabrication, the dye sensitised solar cell module was characterised by placing it under a source that artificially replicated the solar spectrum in the visible region to provide an illumination of 0.10 sun.

Figure 13:
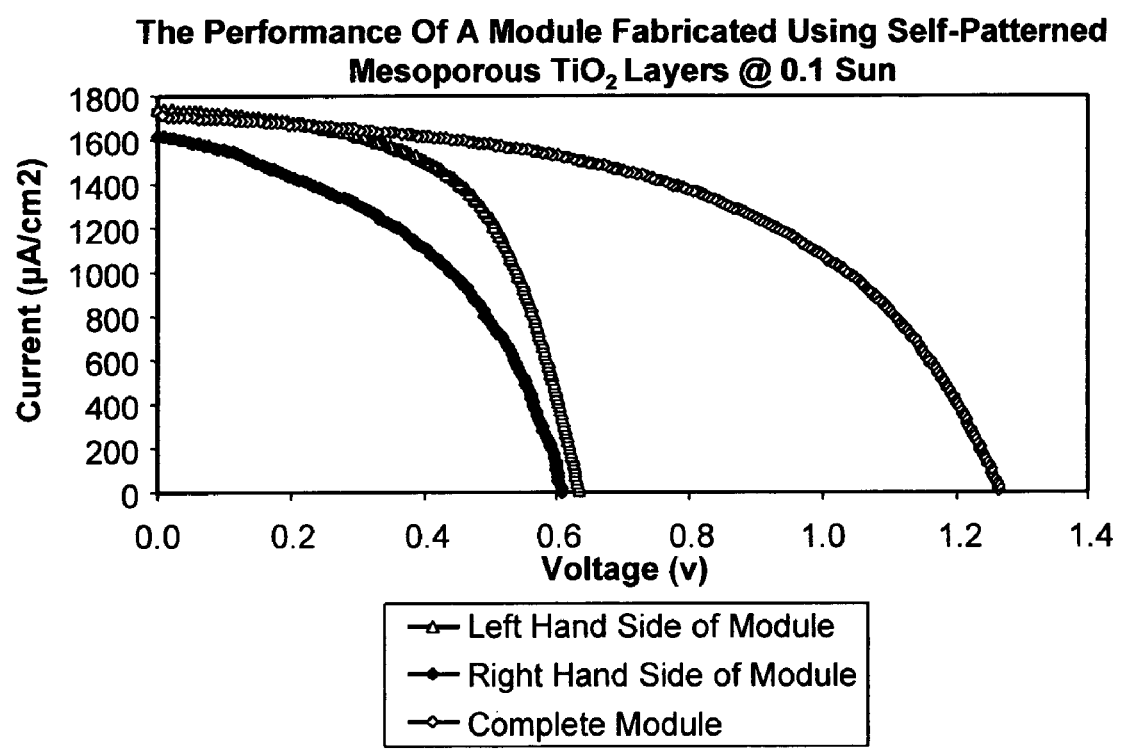
FIG. 13 is a graph illustrating current versus voltage for the module fabricated in accordance with the invention.

The data in FIG. 13 demonstrate that modules fabricated using the processes described above give acceptable results. When each side of the module was tested individually, good current and voltage was achieved and when the complete module was tested, double the voltage was achieved which was expected as the individual cells were connected in series.

This example demonstrates that AP-ALD layers can be used to self pattern mesoporous nano particulate TiO$_2$ layers which then may be used to create a working PV module.

The example shows that by depositing a thin layer of TiO$_2$ above the mesoporous layer by atomic layer deposition the mesoporous layer, together with the layer of TiO$_2$, fell off the substrate unless a thin layer of TiO$_2$ was also present between the conducting electrode and the mesoporous nano particulate layer. This leaves a patterned mesoporous nano particulate layer that may be used to create a PV module.

The thickness of the TiO$_2$ layers laid down by ALD is less than 100 nm. Preferably the thickness is less than 20 nm or even less than 5 nm.

The example was performed using titanium dioxide. The mesoporous layer could equally be zinc oxide or tin oxide.

Any suitable additive process may be used to lay down the original pattern on the substrate. Methods include, but are not limited to, inkjet printing, flexographic printing, a writing device, etc. Preferably the process can be performed roll to roll.

The invention has been described in detail with reference to preferred embodiments thereof. It will be understood by those skilled in the art that variations and modifications can be effected within the scope of the invention.

The invention claimed is:

1. A method of patterning a mesoporous nano particulate layer on a conductive substrate comprising the steps of depositing a pattern on the conductive substrate, depositing a first layer of titanium dioxide by atomic layer deposition on the conductive substrate, removing the pattern with a solvent to leave discrete areas of titanium dioxide, depositing a mesoporous nano particulate layer over the conductive substrate, and depositing a second layer of titanium dioxide by atomic layer deposition above the mesoporous nano particulate layer whereby areas of the mesoporous nano particulate layer and the second titanium dioxide layer over the areas where the first layer of titanium dioxide was removed with the solvent fall off, leaving a patterned mesoporous nano particulate layer.

2. A method as claimed in claim 1 wherein the titanium dioxide layers are deposited by simultaneously directing a series of gas flows along elongated channels such that the series of gas flows are substantially parallel to a surface of the conductive substrate and substantially parallel to each other, whereby the series of gas flows are substantially prevented from flowing in the direction of the adjacent elongated channels, and wherein the series of gas flows comprises, in order, at least a first reactive gaseous material, an inert purge gas, and a second reactive gaseous material, wherein the first reactive gaseous material is capable of reacting with a substrate surface treated with the second reactive gaseous material.

3. A method as claimed in claim 1 wherein the mesoporous nano particulate layer is formed of titanium dioxide.

4. A method as claimed in claim 1 wherein the mesoporous nano particulate layer is dye sensitised.

5. A method as claimed in claim 1 wherein the pattern is applied by an additive printing process.

6. A method as claimed in claim 5 wherein the pattern is applied by inkjet printing 7. A method as claimed in claim 5 wherein the pattern is applied by flexographic printing.

8. A method as claimed in claim 5 wherein the pattern is applied by means of a writing device containing water insoluble ink.

9. A method as claimed in claim 5 wherein the pattern is applied in a roll to roll manner.

10. A method as claimed in claim 1 wherein each of the TiO$_2$ layers deposited by atomic layer deposition has a thickness of less than 100 nm.

11. A method as claimed in claim 10 wherein each of the TiO$_2$ layers deposited by atomic layer deposition has a thickness of less than 20 nm.

12. A method as claimed in claim 10 wherein each of the TiO$_2$ layers deposited by atomic layer deposition has a thickness of less than 5 nm.

* * * * *